US009693400B2

(12) United States Patent
Sorin

(10) Patent No.: US 9,693,400 B2
(45) Date of Patent: Jun. 27, 2017

(54) MICROWAVE OVEN CAVITY AND MICROWAVE OVEN

(75) Inventor: Tcaciuc Sorin, Satu Mare (RO)

(73) Assignee: Electrolux Home Products Corporation N.V., Brussels (BE)

( * ) Notice: Subject to any disclaimer, the term of this patent is extended or adjusted under 35 U.S.C. 154(b) by 239 days.

(21) Appl. No.: 13/825,184

(22) PCT Filed: Sep. 23, 2011

(86) PCT No.: PCT/EP2011/066550
§ 371 (c)(1),
(2), (4) Date: Apr. 22, 2013

(87) PCT Pub. No.: WO2012/052248
PCT Pub. Date: Apr. 26, 2012

(65) Prior Publication Data

US 2013/0213956 A1 Aug. 22, 2013

(30) Foreign Application Priority Data

Oct. 21, 2010 (EP) .................................... 10013871

(51) Int. Cl.
*H05B 6/64* (2006.01)
*C23C 16/00* (2006.01)
*H05B 6/74* (2006.01)

(52) U.S. Cl.
CPC ............. *H05B 6/6402* (2013.01); *H05B 6/74* (2013.01)

(58) Field of Classification Search
CPC .......... H05B 6/74; H05B 6/64; H05B 6/6402; G02B 5/09; G02B 27/44
USPC .................. 219/745, 746, 728, 756; 118/725
See application file for complete search history.

(56) References Cited

U.S. PATENT DOCUMENTS 4,319,125 A * 3/1982 Prince ....................... F24C 1/10 126/92 B
4,800,090 A * 1/1989 August ................... A23L 1/217 426/243
5,290,985 A * 3/1994 Jancic et al. .................. 219/725
5,353,037 A * 10/1994 Jones ....................... H01Q 1/02 343/704
5,389,944 A * 2/1995 Collinge et al. .............. 343/910
5,486,950 A * 1/1996 Collinge ....................... 359/565
5,919,391 A * 7/1999 Jun .............................. 219/746
6,507,441 B1 * 1/2003 Eisenberg et al. ............ 359/627
(Continued)

FOREIGN PATENT DOCUMENTS

WO 02063926 8/2002

OTHER PUBLICATIONS

Black, Donald N., and James C. Wiltse. "Millimeter Wave Characteristics of Phase Correcting Fresnel Zone Plates." IEEE Transactions on Microwave Theory and Techniques 35.12 (1987): 1122-128.*

(Continued)

*Primary Examiner* — Quang Van
(74) *Attorney, Agent, or Firm* — Pearne & Gordon, LLP

(57) ABSTRACT

The present application in particular is directed to a microwave oven cavity (1). In order to obtain uniform heating and excellent heating efficiency, at least one inner wall (4) comprises at least one Fresnel reflective element (7) adapted to reflect microwaves coupled into the cavity (1) from a microwave source (5).

17 Claims, 8 Drawing Sheets

(56) References Cited

U.S. PATENT DOCUMENTS

| | | | | |
|---|---|---|---|---|
| 6,559,460 | B1 * | 5/2003 | Keogh | H01J 65/044 250/492.1 |
| 6,674,056 | B2 * | 1/2004 | Lee | 219/745 |
| 7,498,549 | B2 * | 3/2009 | Gallivan | H01L 21/67115 219/745 |
| 8,496,358 | B2 * | 7/2013 | McEntee | 362/297 |
| 8,890,073 | B2 * | 11/2014 | Karam et al. | 250/341.3 |
| 9,090,114 | B1 * | 7/2015 | Stumm | B41M 7/0045 |
| 2004/0240034 | A1 * | 12/2004 | Scharf | G02B 5/18 359/293 |
| 2005/0063079 | A1 * | 3/2005 | MacKinnon et al. | 359/853 |
| 2006/0032447 | A1 * | 2/2006 | Liu et al. | 118/725 |
| 2009/0252537 | A1 * | 10/2009 | Choi et al. | 399/221 |
| 2011/0108741 | A1 * | 5/2011 | Ingram | G01N 21/4738 250/492.1 |
| 2011/0266717 | A1 * | 11/2011 | Nehls | B29C 35/0805 264/413 |
| 2012/0196011 | A1 * | 8/2012 | Felix | 426/243 |

OTHER PUBLICATIONS

International Search Report for PCT/EP2011/066550, dated Nov. 3, 2011, 3 pages.

* cited by examiner

MICROWAVE OVEN CAVITY AND MICROWAVE OVEN

The present application is directed to a microwave oven cavity and a microwave oven comprising such a cavity.

Microwave oven cavities usually are adapted to heat specific loads in a microwave electric field generated by coupling electromagnetic waves, i. e. microwaves, into the microwave cavity.

Standing electromagnetic waves establishing within the cavity make it difficult to generate or keep a constant and uniform electric field. This in turn results in a peak-to-peak variation in the intensity of electric field lines in the cavity, in particular preventing uniform heating of the targeted load.

The value of the microwave power absorbed in the unit volume of the load to be heated is a function of several parameters as well as the generator's frequency, electric permittivity, the dielectric loss of the complex impedance loads or strength of the electric field inside the load. The last one is most significant and responsible for variations of temperature within the load.

Generally, to ensure uniform heating or to prevent overheated areas, known microwave applicators are providing at least one of the following methods:

- a stirrer at a microwave feeding input which will change the incident angles of the electromagnetic field, thereby changing the positions of the standing microwaves; or
- moving the load position on heating area by using a rotating plate or a linear conveyor;

The methods mentioned so far are comparatively elaborate and/or costly. Hence, there is still need to improve uniform heating and heating efficiency.

It is therefore an object of the invention to overcome the known disadvantages. In particular, there shall be provided a microwave oven cavity with improved uniform heating and excellent heating efficiency. Further, a microwave oven shall be provided.

This object is achieved by the independent claims. Embodiments thereof result from the dependent claims.

According to claim 1, a microwave oven cavity is provided, in which at least one inner wall comprises at least one Fresnel reflective element. Such a Fresnel reflective element is adapted to reflect microwaves coupled from a microwave source into the cavity in a predetermined manner. The Fresnel reflective element may comprise several Fresnel zones, comparable to a Fresnel lens in optics. Reflection of the microwaves within the cavity is modified by the at least one Fresnel reflective element such that hot and/or cold spots in a load, which may be a food item for example, can be prevented. Hence, uniform heating and excellent heating efficiency can be obtained.

The invention is in particular based on the finding, that one relevant factor for obtaining uniform heating is to ensure a correct path of microwaves within the microwave cavity. A correct or adequate path of microwaves inter alia depends on the inner geometry of the cavity, the wavelength or range of wavelengths of the microwave source and propagation modes of the electromagnetic field within the cavity.

Further, the position of the microwave source, which may be a microwave feeder, i. e. the location where microwaves are coupled into the cavity plays a major role with respect to heating uniformity and heating efficiency.

Therefore, in order to increase the heating uniformity and to reduce standing wave effects, the present invention proposes to use Fresnel reflective elements provided with the inner walls of the microwave oven cavity.

Inner walls of a microwave oven cavity comprising one or several Fresnel reflective elements, in particular inner walls nearly completely covered or provided with Fresnel reflective elements, can be designated as Fresnel reflective walls. The Fresnel reflective elements can be considered to represent inverse Fresnel lenses, which are well known in optics.

A Fresnel reflective element can comprise at least one facet, preferably of linear type. The term linear type shall mean that the facet runs in parallel and along a lateral or longitudinal direction of an inner wall, preferably a side wall of the cavity. Such a linear type facet can be thought to implement a reflective parallel strip having a certain geometry and reflectivity. Facets may be provided with an inner wall in a transversal or longitudinal direction thereof. The term of linear type shall in particular point out, that the facet is linear in at least one of its dimensions. If a Fresnel reflective element comprises several facets that are arranged side by side, and the geometry of the facets is adapted accordingly, a linear Fresnel reflector is obtained. Such a linear Fresnel reflector may reflect microwaves into parallel columnar volume elements of the cavity, but also may focus microwaves impinging on the Fresnel reflector to a given area within the cavity, preferably an area in which a load is placed or located.

The use of Fresnel reflective elements or Fresnel reflective walls will lead to enhanced uniform heating and excellent heating efficiency. For example, three vertical walls of a conventional microwave cavity of a microwave oven can be Fresnel reflective walls.

In providing such Fresnel reflective elements it is in particular possible to solve electromagnetic density issues of reflected waves, in particular in cases where a comparatively large amount of the microwave power is absorbed by the load.

Each Fresnel reflective wall may have a different target area within the cavity, and may cover the active area within the microwave oven cavity not only with respect to the surface, but also with respect to the volume of a load.

An aperture of the at least one Fresnel reflective element may be at least partially of circular, ellipsoidal, hyperbolic or parabolic shape. The shape of the aperture of Fresnel reflective elements making up a Fresnel reflector, inter alia may be selected according to shape and dimension of the microwave cavity and other relevant parameters. For example, a circular shape may be used with a square active area of the microwave cavity, and an elliptic shape may be used with a rectangular active area.

In preferred embodiments, at least one side wall, preferably three side walls of the cavity, comprises at least one Fresnel reflective element having facets of linear type. It is preferred that the facets of such a linear Fresnel reflector run in a direction from a bottom to a top wall of the cavity. However, it shall be mentioned, that the position and orientation of the facets may depend on the position of the microwave source, or the microwave feeder, relative to the cavity, Facets running from bottom to top, or vice versa, can in particular be used for microwave sources or feeders arranged in or at the top or upper wall of the cavity.

The Fresnel reflective elements running between opposite walls of the cavity, such as between the bottom and top wall or between opposite side walls, may extend over nearly the whole distance between respective walls, such as their lateral or longitudinal dimensions. In this case, excellent heating characteristics can be obtained. However, it is also possible that at least one Fresnel reflective element or facet thereof extends only over a section of respective wall dimensions. In the case that the Fresnel reflective elements extend between the bottom and top wall of the cavity, the longitudinal dimension of respective Fresnel reflective elements of facets preferably is equal to about the distance between the bottom and top wall. Here, a maximum of microwave energy can be applied to the load.

In an embodiment, the at least one Fresnel reflective element is adapted to reflect at least microwaves of a given range of wavelengths, and wherein a width of the at least one Fresnel reflective element, preferably of each facet, at right angle to its longitudinal direction is greater than half of the center wavelength of the range of wavelengths. The term "range of wavelengths" shall in particular account for the fact that even "monochromatic" microwave sources generally emit a spectrum of microwave wavelengths. If a microwave source is used that in principle generates only one single wavelength, this single wavelength will correspond to the center wavelength. This situation applies to most microwave ovens which use magnetrons of given frequencies, such as 2.45 GHz and others.

In the case that a microwave source of 2.45 GHz is used, the width is preferably in the range from 65 mm to 85 mm.

In a further preferred embodiment, the depth of a Fresnel reflective element, preferably of each facet, at a right angle both to the longitudinal direction thereof and to the inner wall is one quarter of the center wavelength of the range of wavelengths at the most. In this case, the microwave source is of 2.45 GHz type, the depth preferably is in the range from 5 mm to 30 mm.

In a particular embodiment, at least one microwave source and at least one Fresnel reflective element are positioned and aligned such that (i) $\alpha=\frac{1}{2}(90°-\beta)$, (ii) $\beta=90°-2\alpha$ and (iii) $\gamma=2\alpha$, wherein $\alpha$ is an angle of inclination of a Fresnel reflective element, in particular a facet, relative to a lateral dimension of a respective inner wall, $\beta$ is a microwave feeding angle, and $\gamma$ is a mirror angle related to the surface normal of the respective Fresnel reflective element or facet.

Depending on the angle of propagation of microwaves, the given arrangement causes microwaves impinging on a Fresnel reflective element either to be reflected in areas of parallel columnar volumes or to be focused into a given active area.

In particular with microwave sources of 2.45 GHz, it is of advantage if the angle of inclination $\alpha$ lies in the range from 3 degrees to 30 degrees, the microwave feeding angle $\beta$ lies in the range from 30 degrees to 84 degrees and the mirror angle $\gamma$ lies in the range from 6 degrees to 60 degrees.

In a further preferred embodiment, the at least one Fresnel reflective element is shielded against dirt by a microwave transparent cover. The cover in particular can be made from at least one of glass, pottery and plastics. The Fresnel reflective element may be attached to the cover which means that the cover which functions as a substrate or carrier for the cover, or the cover may be positioned in front of a respective wall of the cavity, i. e. in front of the Fresnel reflective element.

In order to obtain a maximal uniformity and effectiveness of heating it is of particular advantage if at least three side walls of the cavity are provided with Fresnel reflective elements.

In an embodiment, the at least one Fresnel reflective element is arranged and designed such that microwaves emitted by the microwave source and impinging on the Fresnel reflective element are reflected into a respective parallel strip or columnar volume, and that microwaves impinging basically at right angle to the inner wall or inner walls are focused to a given area or volume, in particular an active zone, of the cavity. Here, in particular effective and uniform heating can be obtained.

According to independent claim 15 there is provided a microwave oven comprising a microwave oven cavity of any embodiment as described beforehand. As to advantages and advantageous effects of the microwave oven, reference is made to the description above.

Embodiments of the invention will now be described in connection with the annexed figures, in which FIG. 1 schematically shows a perspective view of a microwave cavity;

Figure 7:
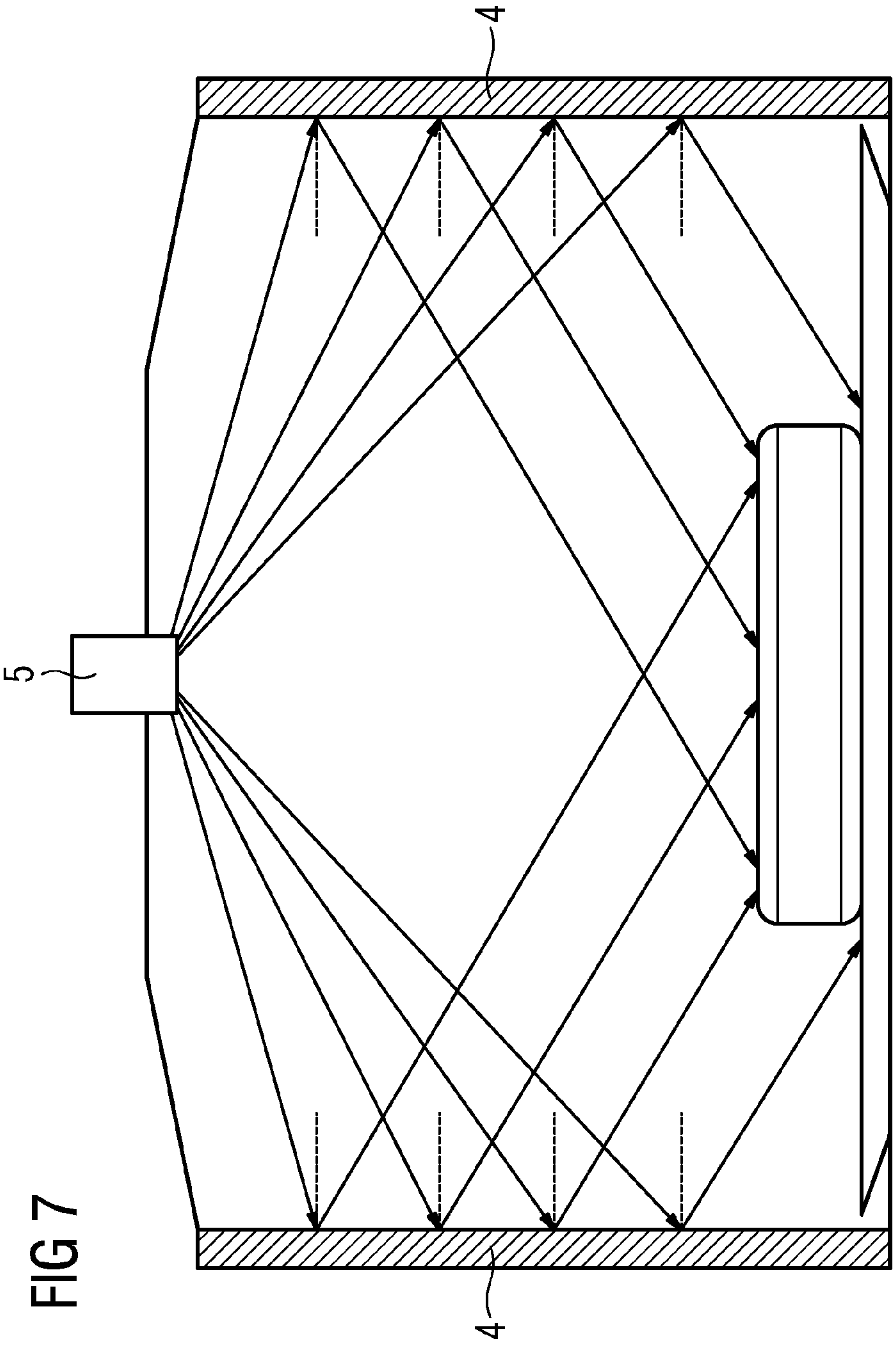
Figure 8:
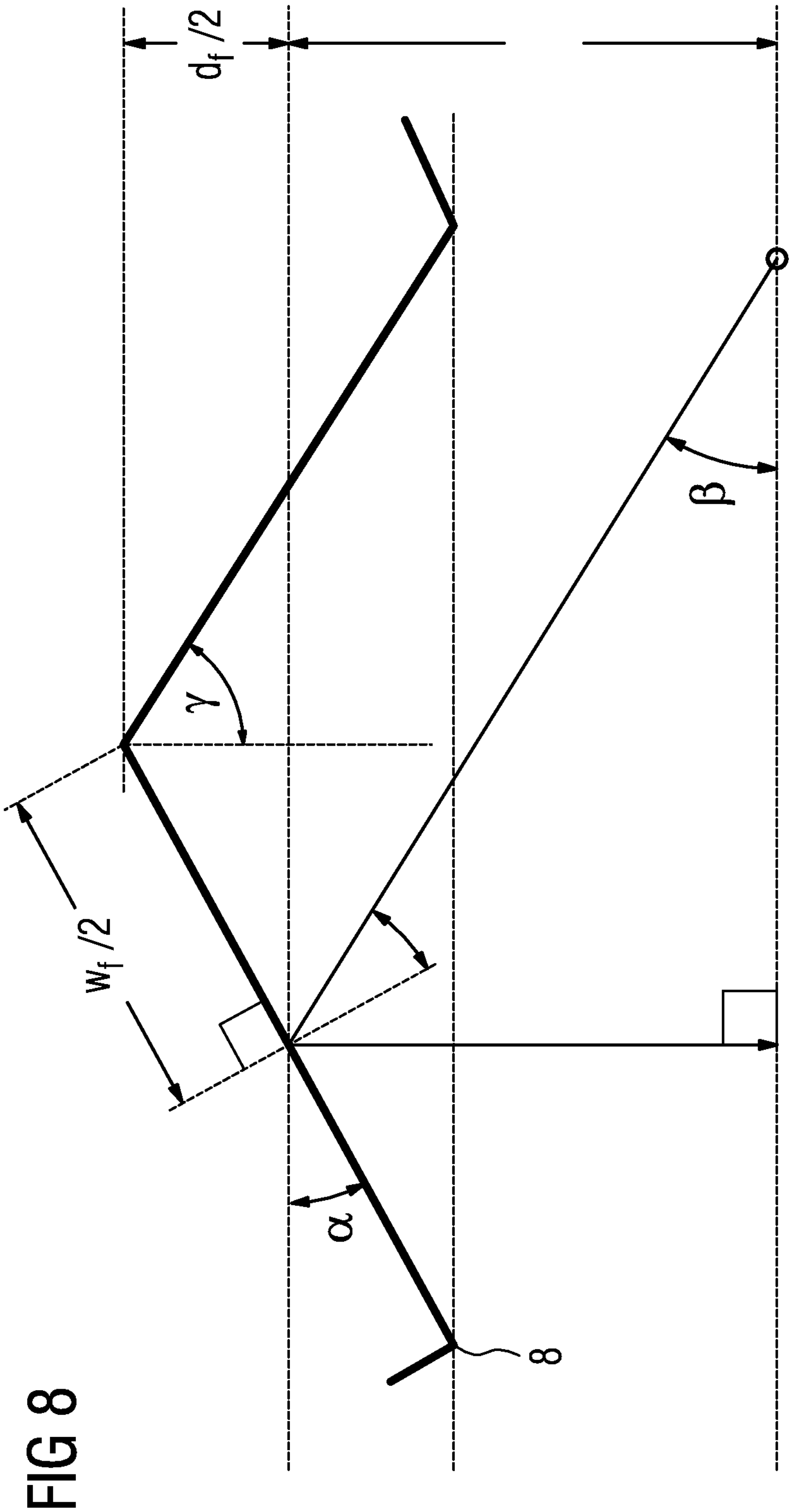
Figure 9:
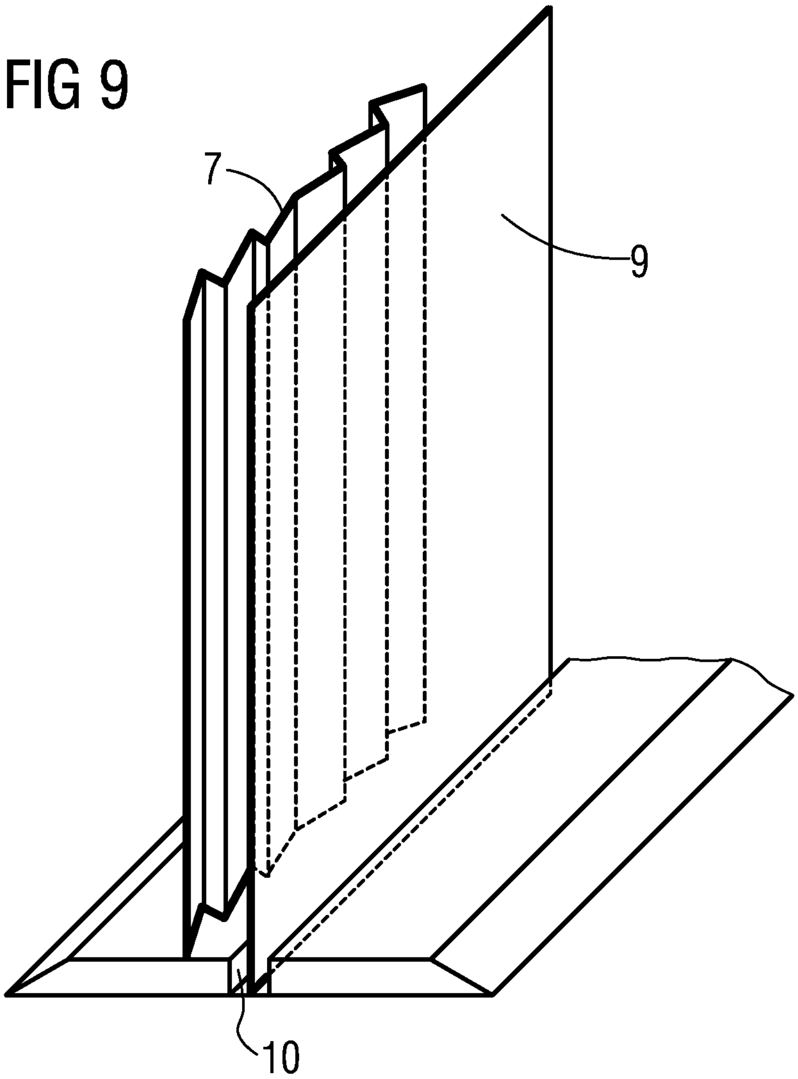

FIG. 7 visualizes in a cross-sectional view microwave reflection within the microwave cavity;

FIG. 8 shows geometric relationships of facets of the Fresnel reflective elements;

FIG. 9 shows a section of a Fresnel reflective element together with a cover plate.

The following description of embodiments shall not be construed as limiting the scope of the invention. In particular, features jointly shown in any of the figures can be implemented alone or in any other combination as discussed further above.

If not otherwise stated like elements are denoted by like reference signs throughout the figures. The figures may not be true to scale, and scales of different figures may be different.

Figure 1:
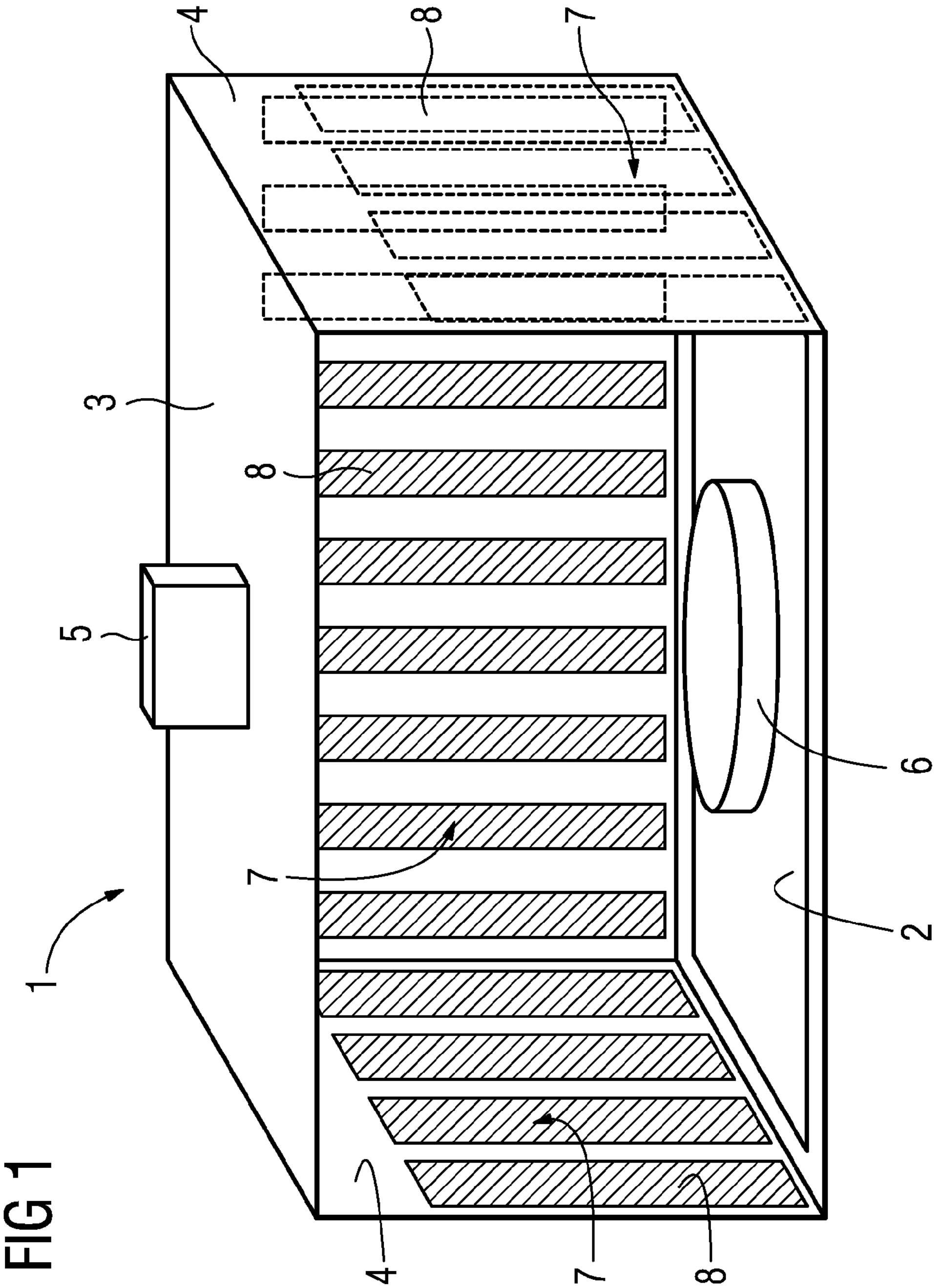

FIG. 1 schematically shows a perspective view of a microwave cavity 1. The cavity 1 comprises a bottom wall 2, a top wall 3 and three side walls 4, in more detail a left side wall, a right side wall and back side wall.

A microwave source 5, which may be a microwave feeder having means for coupling microwaves generated by a magnetron into the cavity 1, is arranged at the top wall 3 and attached thereto in order to properly couple microwaves into the cavity 1. Approximately in the center of the bottom wall 2 a load 6 to be heated with microwaves emitted by the microwave source 5 is placed.

In order to ensure efficient and uniform heating, the three side walls 4, comprise Fresnel reflective elements 7. In the present case, each side wall 4 comprises one Fresnel reflective element 7 and each Fresnel reflective element 7 in turn comprises several facets 8. The facets 8 are linear, strip-shaped microwave reflective elements running along the side walls from the bottom wall to the top wall.

In order to obtain uniform heating, the facets 8, in more detail reflective faces of the facets 8, are oriented in a special way as is described further below.

Figure 2:
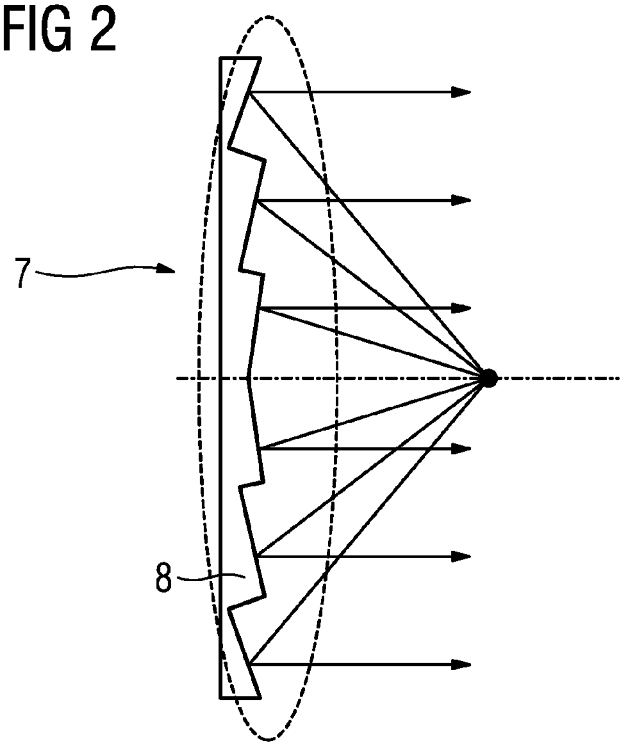
FIG. 2 shows a cross sectional view of a Fresnel reflective element.
Figure 3:
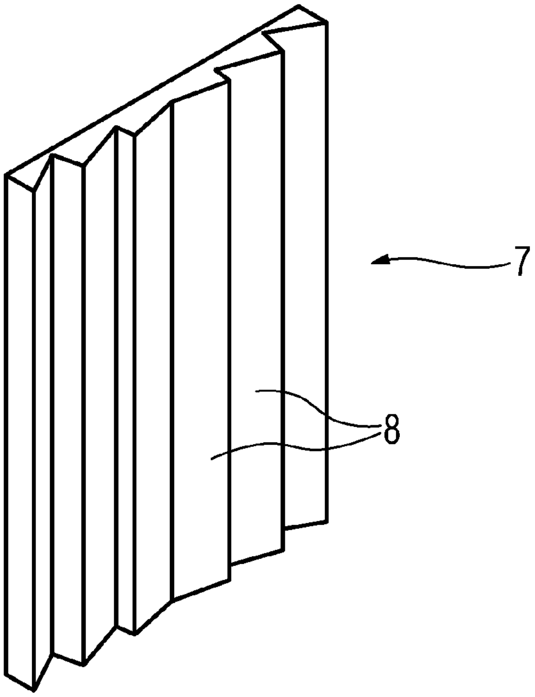
FIG. 3 shows a perspective view of the Fresnel reflective element.

FIGS. 2 and 3 show a cross-sectional and perspective view of a Fresnel reflective element 7. As can be seen, the facets 8 are oriented such that the Fresnel reflective element 7 has an ellipsoidal shaped aperture, which is indicated by the ellipse shown in FIG. 2. Such an aperture is advantageous for rectangular shaped active zones within the microwave cavity 1. Other active zones may require other apertures in order to obtain even and homogeneous heating. For example, circular apertures are adequate for square active zones.

As can be seen from FIG. 2, microwaves emitted at a focal point can be parallelized and parallel microwaves impinging on the Fresnel reflective element 4 can be focused.

Figure 4:
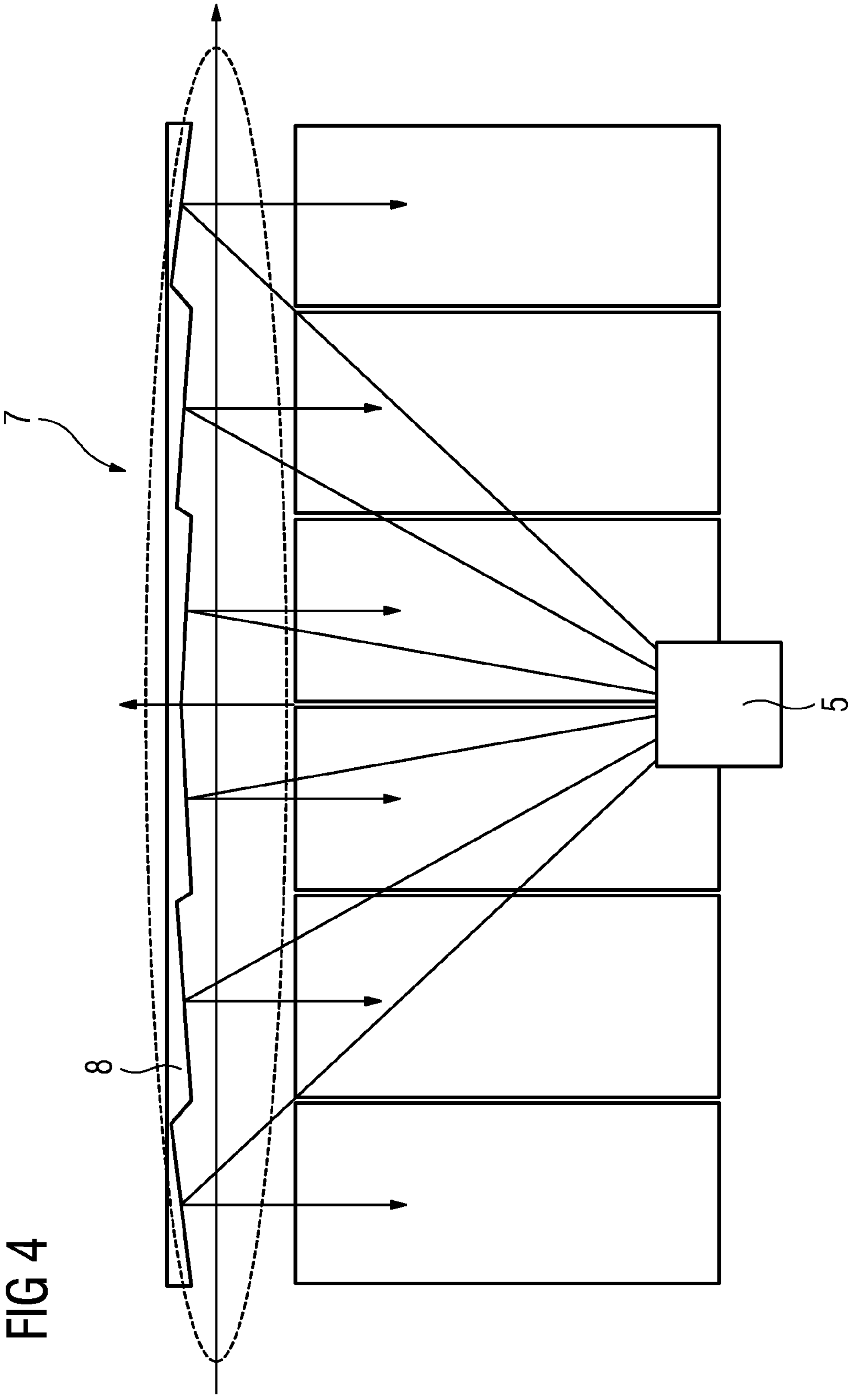
FIG. 4 shows a top view of a Fresnel reflective element together with a microwave source.

FIG. 4 shows a top view of a Fresnel reflective element 7 together with the microwave source 5. The microwave source 5 is positioned in or near the focal point of the Fresnel reflective element 7, or in other words, the facets are designed and oriented such that the microwave source 5 lies approximately in or near the focal point.

Microwaves emitted by the microwave source 5 and impinging on the Fresnel reflective element 7 are parallelized, which is visualized in FIG. 4 by central beams impinging on the facets 8 as well as shaded parallel strips.

Figure 5:
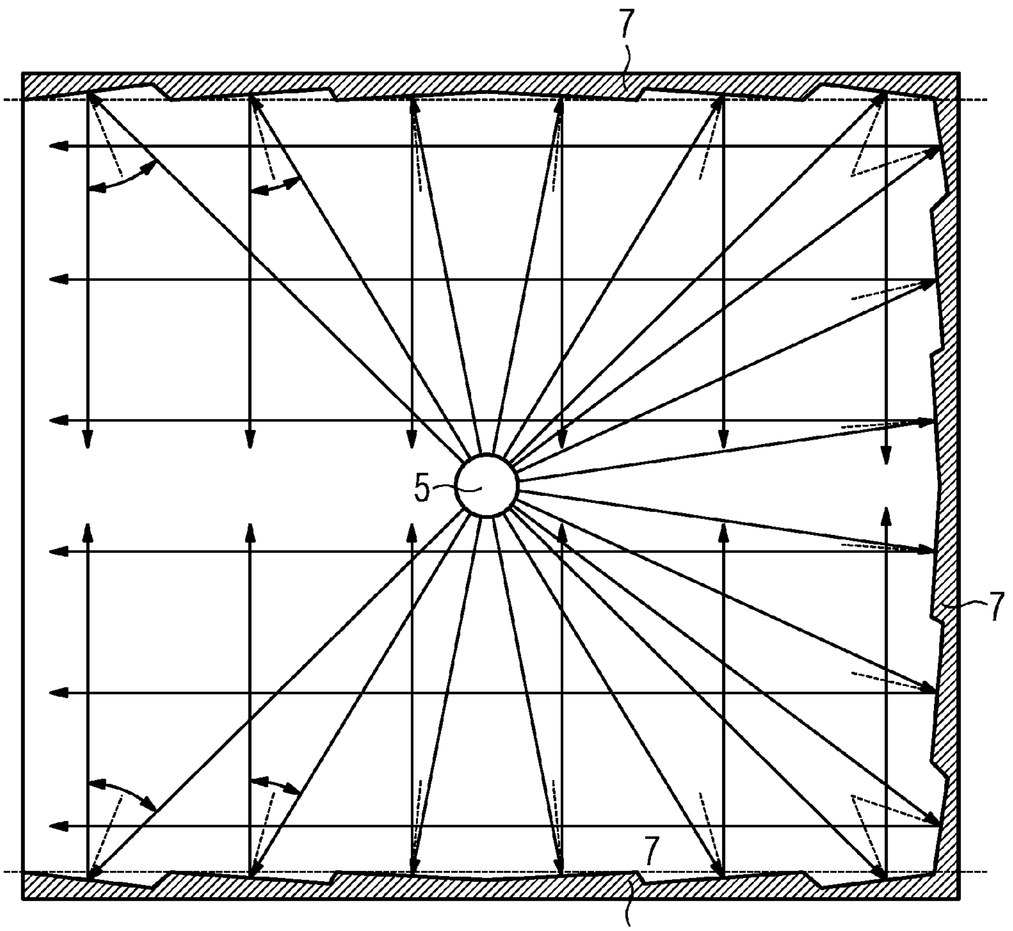
FIG. 5 shows a top view of a the microwave cavity.

FIG. 5 shows a top view of the microwave cavity 1 having three Fresnel reflective elements 7. The Fresnel reflective elements 7, in particular facets 8 thereof, are arranged and adapted such that their focal points coincide with the position of the microwave source 5. As already mentioned, the microwave source 5 may be a microwave feeder for coupling microwaves into the microwave cavity 1.

Microwaves coupled into the microwave cavity 1 which impinge on the Fresnel reflective elements 7 prior to being absorbed by the load 6 are parallelized, i. e. reflected in parallel volume strips as defined by the orientation of the facets 8. In FIG. 5 reflection of microwaves emitted by the microwave source 5 is visualized by respective central beams.

Figure 6:
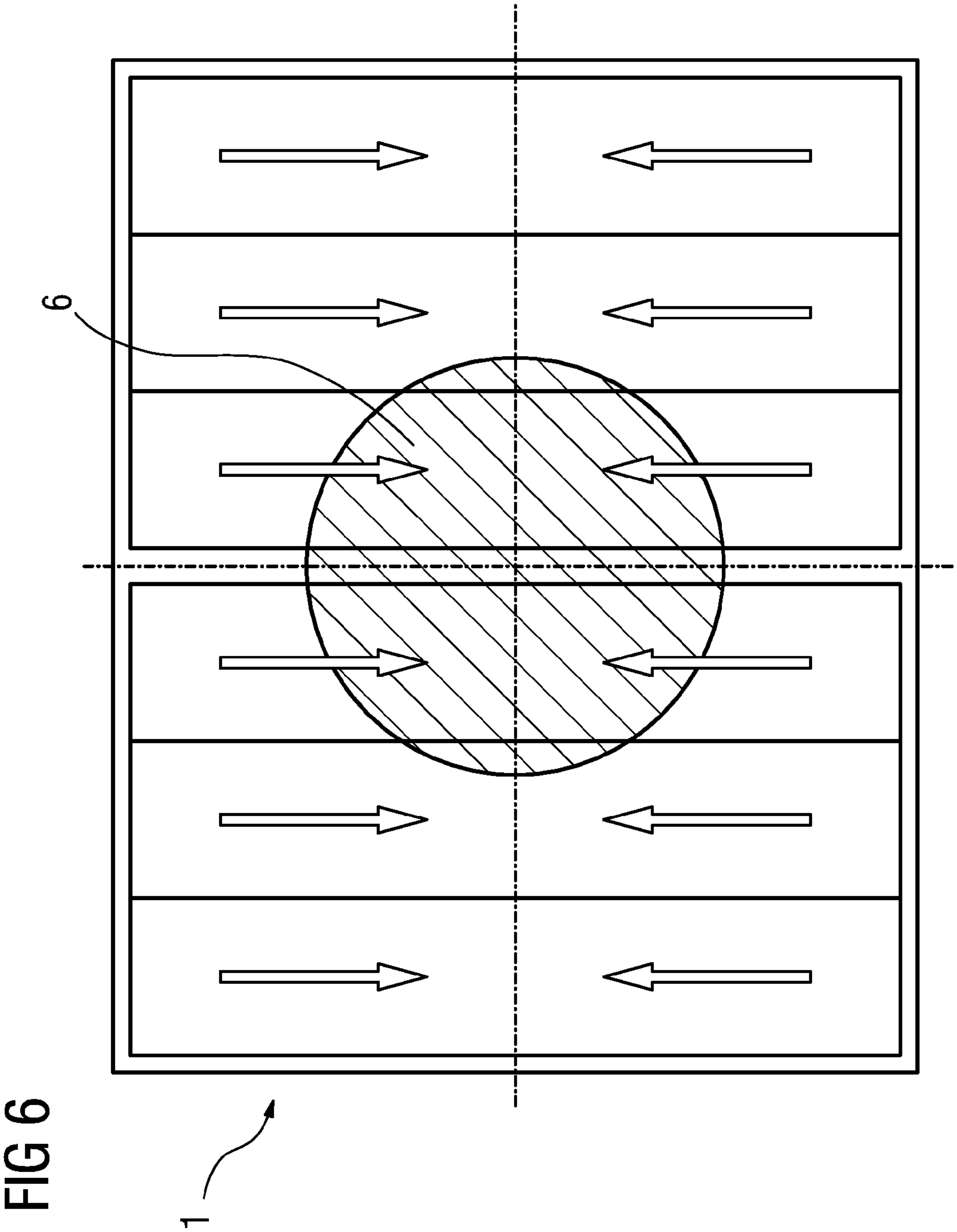
FIG. 6 shows in a top view a microwave distribution in the microwave cavity.

As becomes clear from FIGS. 4 and 5, microwaves that are first reflected at a side wall 4 before being absorbed by the load 6 are distributed evenly over the volume of the microwave cavity 1, which is visualized my means of shaded strips and arrows in FIG. 6. This favourable microwave distribution obtained in connection with the Fresnel reflective elements 7 leads to uniform heating patterns while preventing hot and cold spots.

FIG. 7 visualizes in a cross-sectional view microwave reflection within the microwave cavity 1. As can be seen, microwaves emitted by the microwave source 5 and having a component of propagation in a downward direction are reflected to the area in which the load 6 is located.

Microwaves that are not absorbed by the load 6 and which are reflected at an inner wall once again will be focused to the active area of the microwave cavity 1 in which the load 6 is located.

In all, it can be seen, that the Fresnel reflective elements 7 provided with inner walls 4 lead to a more uniform and even distribution of microwave radiation within the microwave cavity 1. Further, due to the fact that microwaves are also focussed towards the active area of the microwave cavity 1 excellent heating efficiency can be obtained.

FIG. 8 shows geometric relationships of a facet 8 of the Fresnel reflective element 7, which relationships are especially advantageous for obtaining uniform and effective heating. The relationships in principle apply to any facet 8 of the Fresnel reflective elements 7. A central beam as already shown in FIG. 4 and FIG. 5 is representative of microwave radiation impinging on the Fresnel reflective element 7.

In FIG. 8, the angle α is the angle of inclination of the facet 8, i. e. the inclination of the facet 8 relative to the lateral extension of a respective side wall 4. The angle β is the microwave feeding angle, which is the angle between the central beam emanating from the microwave source 5 and a plane parallel to the respective side wall 4. The angle γ is a mirror angle related to the surface normal of the respective Fresnel reflective element, or in more detail, the angle between the surface normal and the central beam, which can be designated as angle of incidence. Note that the values of angles α, β, and γ have specific values for each facet.

According to FIG. 8 the following relationships between the angles α, β, and γ apply:

$$\text{since:}\begin{cases} \sin\alpha = \dfrac{d_f}{w_f}; \\ \beta + \gamma = 90; \\ \alpha + \beta + \dfrac{\gamma}{2} = 90; \end{cases}$$

$$\text{hence:}\begin{cases} \gamma = 2\cdot\alpha \\ \beta = 90^\circ - 2\cdot\alpha \\ \alpha = \dfrac{90^\circ - \beta}{2} \end{cases},$$

wherein $d_f$ is the depth of the facet 8 under corresponding angle α, and $w_f$ is he width of the respective facet 8 at right angle to its longitudinal direction.

Using angular calculation methods the following equations apply:

$$\begin{cases} \alpha[\text{rad}] = \arcsin\left(\dfrac{90^\circ - \beta}{2}\right) = \arcsin\left(\dfrac{\gamma}{2}\right); \\ \beta[\text{rad}] = \arctan(90^\circ - 2\cdot\alpha) = \arctan(90^\circ - \gamma); \\ \gamma[\text{rad}] = 2\cdot\arcsin\alpha \end{cases}$$

The above relationships more or less define the mutual arrangement of at least the facets 8 of the Fresnel reflective elements and the microwave source 5. As has been shown further above, using such an arrangement leads to more uniform heating patterns and excellent heating efficiency.

In a microwave oven having a microwave source 5 operating at 2.45 GHz preferred values of the above parameters are as follows:

α: in the range from 3° to 30°

β: in the range from 30° to 84°

γ: in the range from 6° to 60°

$w_f$: in the range from 65 mm to 85 mm $d_f$: in the range from 5 mm to 30 mm

For other operating frequencies, these parameters may be adapted accordingly, wherein as a general rule, the width $w_f$ shall be greater than half the corresponding center wavelength of the microwave source, and the depth $d_f$ shall be smaller than a quarter of the center wavelength.

FIG. 9 shows a section of a Fresnel reflective element 7 that is shielded by a cover plate 9. The cover plate 9 is made from a microwave transparent material such as plastic, glass, pottery and the like.

The cover plate 9 shields the inner wall 4 of the microwave cavity 1 carrying the Fresnel reflective element 7 from dust and soil and also protects the Fresnel reflective element 7 against damage. Such a cover plate 9 greatly simplifies cleaning of the inner walls, due to the fact that implementation of Fresnel reflective elements 7, in particular facets 8, leads to corrugated surface structures which, as a general rule, are more difficult to clean that smooth surfaces of cover plates 9.

In the embodiment shown in FIG. 9, the cover plate 9 is retained in a groove 10 provided in the bottom 2 and/or top wall 3 of the microwave cavity 1. Such a groove 10 may simplify removal, insertion or replacement of respective cover plates 9 while providing a firm hold. If the groove 10 is adapted accordingly, the cover plate 9 may be removed and inserted in a sliding motion, in which the upper and lower edges of the cover plate 9 are guided in the grooves 10. However, also other ways of attachment of the cover plate 9 are conceivable.

In all, it can be seen, that the Fresnel reflective elements 7 are effective in providing a more even distribution of microwaves, leading to uniform heating patterns and excellent heating efficiency.

LIST OF REFERENCE NUMERALS

1 microwave cavity
2 bottom wall,
3 top wall
4 side wall
5 microwave source
6 load
7 Fresnel reflective element
8 facet
9 cover plate
10 groove

The invention claimed is:

1. Microwave oven cavity (1), for uniformly heating a food item in the oven cavity, comprising:

a bottom wall (2), a top wall (3), a first inner side wall (4), and a second inner side wall (4);

a microwave source (5);

at least two Fresnel reflective elements (7) adapted to reflect microwaves coupled into the cavity (1) from the microwave source (5), wherein a first Fresnel reflective element extends along the first inner side wall (4) and reflects microwaves in a first reflected direction and a second Fresnel reflective element extends along a second inner side wall (4) and reflects microwaves in a second reflected direction, wherein the reflected microwaves reflected from the first Fresnel reflective element intersect the reflected microwaves reflected from the second Fresnel reflective element at right angles, and wherein the first Fresnel reflective element (7) collimates the microwaves from said microwave source in the first reflected direction and the second Fresnel reflective element (7) collimates the microwaves from said microwave source in the second reflected direction, and said microwave source is located at common focal point of the first Fresnel reflective element and the second Fresnel reflective element, wherein each Fresnel reflective element (7) comprises at least one facet (8) of linear type running along a lateral or longitudinal direction of at least one of the first inner side wall (4) and the second inner side wall of the cavity (1).

2. Microwave oven cavity (1) according to claim 1, wherein an aperture of the at least two Fresnel reflective elements (7) is of circular, ellipsoidal, hyperbolic or parabolic shape.

3. Microwave oven cavity (1) according to claim 1, wherein at least one of the first Fresnel reflective element and the second Fresnel reflective element comprises facets (8) of linear type extending in a direction from a bottom wall (2) to a top wall (2) of the cavity (1).

4. Microwave oven cavity (1) according to claim 1, wherein at least one of the first Fresnel reflective element and the second Fresnel reflective element running between opposite walls of the cavity (1) extends over nearly the whole distance between respective walls (2, 3, 4).

5. Microwave oven cavity (1) according to claim 1, wherein the at least two Fresnel reflective elements (7) are adapted to reflect at least microwaves of a given range of wavelengths, and wherein widths ($W_f$) of the at least two Fresnel reflective elements (7), of each facet (8), at a right angle to its longitudinal direction is greater than half of the center wavelength of the range of wavelengths.

6. Microwave oven cavity (1) according to claim 5, wherein the width ($W_f$) is in the range from 65 mm to 85 mm.

7. Microwave oven cavity (1) according to claim 1, wherein the at least two Fresnel reflective elements (7) are adapted to reflect microwaves of a given range of wavelengths, and wherein depths ($d_f$) of the at least two Fresnel reflective elements (7) at a right angle both to the longitudinal direction thereof and to the respective inner side wall (4) is one quarter of a center wavelength of the range of wavelength at the most.

8. Microwave oven cavity (1) according to claim 7, wherein the depth ($d_f$) is between 5 mm and 30 mm.

9. Microwave oven cavity (1) according to claim 1, wherein at least one of the at least two Fresnel reflective elements (7) and the microwave source (5) is positioned and aligned such that (i) $\alpha=\frac{1}{2}(90°-\beta)$, (ii) $\beta=90°-2\alpha$ and (iii) $\gamma=2\alpha$, wherein $\alpha$ is an angle of inclination of a Fresnel reflective element (7) relative to a lateral dimension of a respective inner side wall (4), $\beta$ is a microwave feeding angle, and $\gamma$ is a mirror angle related to the surface normal of the respective Fresnel reflective element (7).

10. Microwave oven cavity (1) according to claim 9, wherein the angle of inclination $\alpha$ lies in the range from 3 degrees to 30 degrees, the microwave feeding angle $\beta$ lies in the range from 30 degrees to 84 degrees and the mirror angle $\gamma$ lies in the range from 6 degrees to 60 degrees.

11. Microwave oven cavity (1) according to claim 1, wherein the at least two Fresnel reflective elements (7) are shielded against dirt by a microwave transparent cover (9), in particular made from at least one of glass, pottery and plastics.

12. Microwave oven cavity (1) according to claim 1, wherein at least three side walls (4) thereof are provided with Fresnel reflective elements (7).

13. Microwave oven cavity (1) according to claim 1, wherein the at least two Fresnel reflective elements (7) are arranged and designed such that microwaves emitted by the microwave source (5) and impinging on one of the Fresnel reflective elements (7) are reflected into a respective parallel strip or columnar volume, and that microwaves impinging at a right angle to a respective inner side wall (4) are focused to a given area or volume (6) within the cavity (1).

14. Microwave oven comprising a microwave oven cavity (1) according to claim 13.

15. Microwave oven cavity (1) according to claim 1 wherein the reflected microwaves reflected from the first Fresnel reflective element (7) intersect the reflected microwaves reflected from the second Fresnel reflective element (7) such that the intersecting microwaves form a grid.

16. Microwave oven cavity (1) according to claim 1, wherein at least one facet (8) has a width ($W_f$) and an angle of inclination $\alpha$ relative to a lateral extension of a respective inner side wall (4), wherein the angle of inclination $\alpha$ is essentially constant over the entire width ($W_f$).

17. Microwave oven cavity (1) according to claim 1, wherein at least one of the first Fresnel reflective element and the second Fresnel reflective element extends vertically along at least one of the first inner side wall (4) between the bottom wall (2) and the top wall (3) of the cavity (1) and the second inner side wall (4) between the bottom wall (2) and the top wall (2) of the cavity (1), respectively.

* * * * *